United States Patent
Deng et al.

(10) Patent No.: US 9,491,875 B2
(45) Date of Patent: Nov. 8, 2016

(54) FOOT PAD STRUCTURE FOR AN APPARATUS

(71) Applicant: GLOBALFOUNDRIES INC., Grand Cayman (KY)

(72) Inventors: Joe M T Deng, Taipei (TW); Lin Jian-Hua, Taipei (TW); Chien Chung Lin, Taipei (TW); Liu Te-Yu, Taipei (TW)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/554,428

(22) Filed: Nov. 26, 2014

(65) Prior Publication Data
US 2015/0146373 A1    May 28, 2015

(30) Foreign Application Priority Data
Nov. 27, 2013    (TW) ................ 102143309 A

(51) Int. Cl.
*G06F 1/16* (2006.01)
*H05K 5/02* (2006.01)

(52) U.S. Cl.
CPC ............ *H05K 5/0234* (2013.01); *G06F 1/166* (2013.01)

(58) Field of Classification Search
CPC ...... G06F 1/181; G06F 1/1601; G06F 1/166; G06F 1/1616; G06F 1/184; G06F 1/1656; H05K 5/0234; F16M 13/00
USPC ............ 361/679.21, 679.01, 679.26, 679.27, 361/679.02, 679.59
See application file for complete search history.

(56) References Cited

U.S. PATENT DOCUMENTS

| | | | |
|---|---|---|---|
| 7,095,610 B1 * | 8/2006 | Banko ................ | G06F 1/1656 248/615 |
| 7,609,529 B2 | 10/2009 | Chiang et al. | |
| 8,050,032 B2 | 11/2011 | Trang | |
| 8,154,860 B2 * | 4/2012 | Chen ................... | F16M 13/00 135/66 |
| 8,355,247 B2 | 1/2013 | Senatori et al. | |
| 8,531,836 B2 * | 9/2013 | Iwamoto ............ | H05K 5/0234 248/677 |

FOREIGN PATENT DOCUMENTS

| | | |
|---|---|---|
| JP | 2010237603 A | 10/2010 |
| JP | 2013510344 A | 3/2013 |
| TW | M320279 U | 10/2007 |
| TW | 201116971 A | 5/2011 |

OTHER PUBLICATIONS

IBM, (ISC) Self Leveling Device for a Thinkpad, IP.com Prior Art Database Disclosure—IP.com Disclosure No. IPCOM000130149D, Publication Date: Oct. 13, 2005.

* cited by examiner

*Primary Examiner* — Anthony Haughton
*Assistant Examiner* — Ingrid Wright
(74) *Attorney, Agent, or Firm* — Scully Scott Murphy and Presser

(57) ABSTRACT

A foot pad structure adapted for a device housing includes a supporting pad and an engaging shell for containing the supporting pad. At least one engaging component is disposed on an outer surface of the engaging shell and is adapted for engaging with the device housing.

17 Claims, 3 Drawing Sheets

FOOT PAD STRUCTURE FOR AN APPARATUS

This application claims priority to Taiwanese Patent Application 102143309, entitled "FOOT PAD STRUCTURE AND APPARATUS USING THE SAME," filed on Nov. 27, 2013. The disclosure of Taiwanese Patent Application 102143309 is hereby incorporated herein by reference in its entirety for all purposes.

BACKGROUND

The disclosure relates to a support mechanism for an apparatus and, more particularly to a foot pad structure positioned at a bottom of an apparatus.

Typically, a plurality of foot pads have been disposed at a bottom of an apparatus to enhance the stability of the apparatus while resting on a carrying plane. In the conventional art, foot pads have been adhered to a bottom surface of an apparatus through an adhesive material. However, the adhesive material is likely to get damaged due to removal of the foot pads. As a result, the conventional foot pads cannot be reworked.

Moreover, according to the conventional art, at the bottom of the apparatus the bottom structure can be fixed through a fastening element, such as a screw. Although the fastening of the fastening element is reliable, the appearance of the apparatus, which is highly emphasized, is adversely affected. For aesthetic reasons, fastening of the bottom structure at the bottom of an electronic apparatus may be achieved by other than fastening elements. For example, to provide back beauty of a notebook computer, the structure of a host body portion of the notebook computer may be fixed through hooks instead of any fastening elements. In this case, foot pads may be affixed to a bottom of a host body portion of a notebook computer. The foot pads may be made of rubber and the like. However, fixing the foot pads through the hooks may be risky as one of the hooks is likely to fail some reliability tests, such as a free drop test and a shock test.

The conventional art further discloses affixing foot pads to a screw hole through a robust adhesive in order to cover a screw and the screw hole which are otherwise exposed. However, the adhesive is likely to get damaged because of the removal of the foot pads from a case. As a result, the conventional foot pads can only be used once and cannot be mounted and dismounted repeatedly such that the conventional foot pads cannot be reworked and are not reusable.

BRIEF SUMMARY

A foot pad structure adapted for a device housing includes a supporting pad and an engaging shell for containing the supporting pad. At least one engaging component is disposed on an outer surface of the engaging shell and is adapted for engaging with the device housing.

The above summary contains simplifications, generalizations and omissions of detail and is not intended as a comprehensive description of the claimed subject matter but, rather, is intended to provide a brief overview of some of the functionality associated therewith. Other systems, methods, functionality, features and advantages of the claimed subject matter will be or will become apparent to one with skill in the art upon examination of the following figures and detailed written description.

The above as well as additional objectives, features, and advantages of the present invention will become apparent in the following detailed written description.

BRIEF DESCRIPTION OF THE DRAWINGS

The description of the illustrative embodiments is to be read in conjunction with the accompanying drawings.

DETAILED DESCRIPTION

Figure 1:
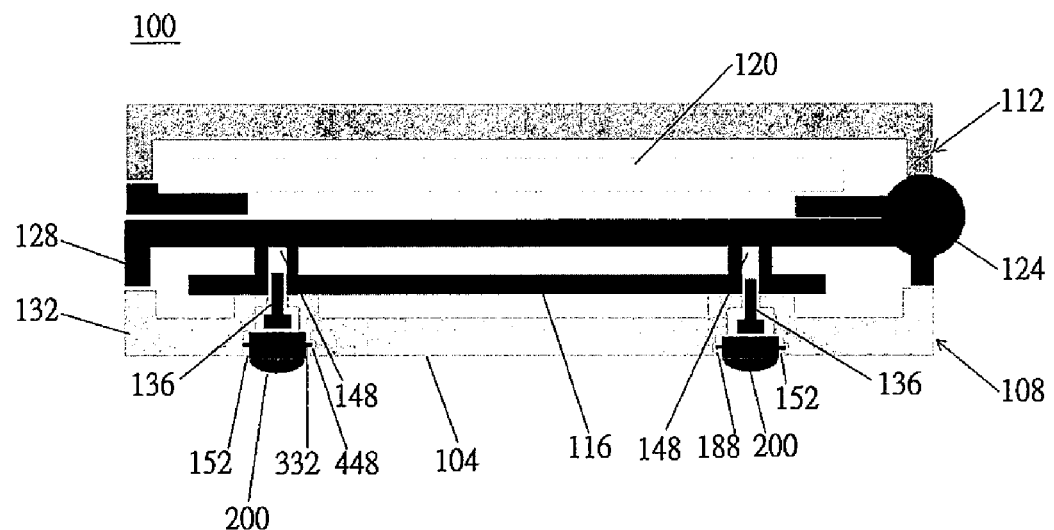
FIG. 1 is a schematic view of an apparatus using a foot pad structure according to an embodiment of the present invention.

The illustrative embodiments provide a foot pad structure for an apparatus.

In the following detailed description of exemplary embodiments of the invention, specific exemplary embodiments in which the invention may be practiced are described in sufficient detail to enable those skilled in the art to practice the invention, and it is to be understood that other embodiments may be utilized and that logical, architectural, programmatic, mechanical, electrical and other changes may be made without departing from the spirit or scope of the present invention. The following detailed description is, therefore, not to be taken in a limiting sense, and the scope of the present invention is defined by the appended claims and equivalents thereof.

It should be understood that the use of specific component, device, and/or parameter names are for example only and not meant to imply any limitations on the invention. The invention may thus be implemented with different nomenclature/terminology utilized to describe the components/devices/parameters herein, without limitation. Each term utilized herein is to be given its broadest interpretation given the context in which that term is utilized. As may be used herein, the term 'coupled' may encompass a direct connection between components or elements or an indirect connection between components or elements utilizing one or more intervening components or elements.

The application of conventional stability-enhancing and vibration-reducing foot pads at the bottom of an apparatus or a product is quite common, but has drawbacks. In view of the drawbacks of the prior art, the present disclosure provides a foot pad structure that is reusable, can be mounted and dismounted without using any tools, and is unlikely to damage an adhesive. The foot pad structure comprises a supporting pad and an engaging shell for containing the supporting pad. At least one engaging component is disposed on an outer surface of the engaging shell and is adapted for engaging with the device housing. In an exemplary embodiment, the engaging shell has a plate and a flange extending from a periphery of the plate in order to define a supporting pad containing region.

In one embodiment, the flange is annular, a plurality of slots are disposed at a margin of the annular flange, and a lower part of the annular flange deforms and retracts when forces are exerted on the lower part of the annular flange in order to facilitate engagement of the engaging shell and the device housing and disengagement of the engaging shell and the device housing. In an exemplary embodiment, the device housing comprises a first casing and a second casing that are fastened through at least one fastening element, and a receiving space for receiving the foot pad structure is defined at a lower part of the second casing relative to the at least one fastening element. The at least one engaging component may comprise a pair of engaging components. The second casing may comprise a pair of engaging slots corresponding in position to the pair of engaging components. The pair of engaging components may be firmly engaged with and positioned in the pair of engaging slots as the foot pad structure is pushed into the receiving space.

In an embodiment, an oblique surface is disposed at the lower part of the second casing defining the receiving space in order to define a gap between the second casing and the foot pad structure. A lower part of a flange of the engaging shell deforms and retracts in response to forces exerted on the lower part of the flange of the engaging shell through the gap such that engagement of the pair of engaging components and the pair of engaging slots and disengagement of the pair of engaging components and the pair of engaging slots are facilitated.

Another aspect of the present disclosure provides an apparatus comprising a shell and a foot pad structure. Another aspect of the present disclosure provides an apparatus comprising a device housing including at least one fastening element. A receiving space is defined under a lower part of the at least one fastening element. A foot pad structure having an outer surface and including at least one engaging component is disposed on the outer surface and adapted for engaging with the device housing. In an exemplary embodiment, the foot pad structure covers the at least one fastening element in response to the foot pad structure engaging with the device housing. Accordingly, the appearance is beautified.

In one embodiment, the foot pad structure comprises a supporting pad and an engaging shell for containing the supporting pad. The engaging shell comprises a plate and a flange extending from a periphery of the plate in order to define a supporting pad containing region. The at least one engaging component is disposed on an outer surface of the flange and is adapted for engaging with and being connected to the second casing. In an exemplary embodiment, the device housing comprises a first casing and a second casing that are fastened through the at least one fastening element. The receiving space is defined at a lower part of the second casing relative to the at least one fastening element. The first casing has a first connection portion and a first recess. The second casing has a second connection portion and a first through hole. The first recess of the first connection portion corresponds in position to the first through hole of the second connection portion. In an embodiment, the at least one fastening element passes through the first through hole of the second casing and enters the first recess of the first casing in order to fasten the first casing and the second casing.

FIG. 1 is a schematic view of an apparatus 100 having a lower surface 104 and using a foot pad structure 200 according to an embodiment of the present disclosure. The apparatus 100 may be, for example, a notebook computer, a tablet, a DVD player, a portable electronic apparatus, a mobile phone, a personal digital assistant (PDA), a server, a home appliance, a measurement instrument, a desktop computer, or an industrial computer, but the present invention is not limited thereto. In an embodiment, a notebook computer 100 taken as an example comprises a thick host body portion 108 and a thin cover portion 112. The host body portion 108 is, for example but not limited to, case-shaped, has the lower surface 104, and contains therein hardware components including but not limited to a circuit board 116, a central processing unit (CPU), a memory, a circuit board, a hard disk drive, and a battery (not shown).

A keyboard apparatus (not shown) is disposed on an upper surface of the host body portion 108 and is adapted to serve as an input apparatus for the notebook computer 100. A display apparatus 120 (including but not limited to a liquid crystal display) is disposed on the cover portion 112 and is adapted to serve as a display unit for the notebook computer 100. A rotation module 124, including but not limited to a shaft module, is disposed at the rear end of the host body portion 108 and is adapted to rotatably support the cover portion 112 relative to the host body portion 108. As is shown in FIG. 1, when a user moves the cover portion 112 to a closed position, the display apparatus 120 and the keyboard apparatus substantially overlap and are not in use. Moreover, when the user wants to use the notebook computer 100, the user moves the cover portion 112 to an opened position such that the display apparatus 120 and the keyboard apparatus are exposed and available for use.

According to another embodiment, the apparatus 100 is a tablet. If the apparatus 100 is a tablet, the rotation module 124 and the cover portion 112, which are shown in FIG. 1, do not exist. The display apparatus includes, but is not limited to, a touch-control display unit disposed on the host body portion 108 and disposed on an upper surface opposite the lower surface 104. According to yet another embodiment, the apparatus 100 is a home appliance or a server. If the apparatus 100 is a home appliance, the rotation module 124 and the cover portion 112, which are shown in FIG. 1, also do not exist. The host body portion 108 comprises casings 128, 132. The casings 128, 132 comprise a first casing 128 and a second casing 132, respectively, wherein at least one fastening element 136 (including but not limited to a screw) operates in conjunction with a screw hole 148 to fasten the first casing 128 and the second casing 132.

A receiving space 152 is disposed at the second casing 132, positioned at the lower part of the screw hole 148, and is adapted to receive a foot pad structure 200. The dimensions of the foot pad structure 200 are designed to allow the foot pad structure 200 to be appropriately engaged and received in the receiving space 152. The cross-sectional schematic view in FIG. 1 only shows two of the foot pad structures 200. However, in practice, the foot pad structures are, for example, in the number of four, six, eight, as needed, but the present invention is not limited thereto. The details and operation of the foot pad structure 200 are explained in detail later.

Figure 2:
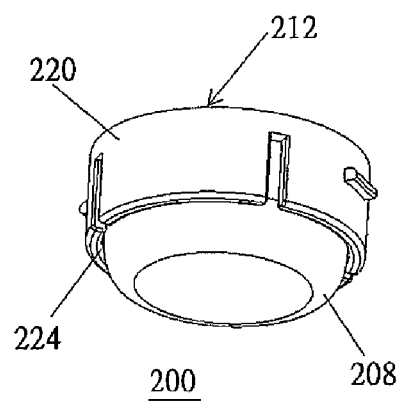
FIG. 2 is a schematic view of the foot pad structure according to another embodiment of the present invention.
Figure 3:
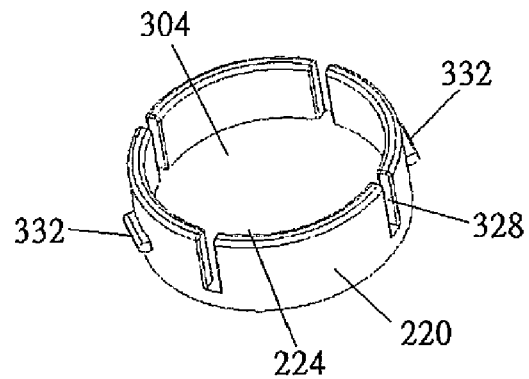
FIG. 3 is a schematic view of the engaging shell according to yet another embodiment of the present invention.

FIG. 2 is a schematic view of the foot pad structure 200 according to one embodiment. The foot pad structure 200 comprises a supporting pad 208 and an engaging shell 212. FIG. 3 is a schematic view of the engaging shell 212. The engaging shell 212 is of a cylindrical shape or any equivalent/similar shape, such as a ellipse shape or a square shape, but the present invention is not limited thereto. In an embodiment, the engaging shell 212 is of a cylindrical shape and has a round plate 304 (see FIG. 3) and an annular flange 220. The annular flange 220 extends from the periphery of the round plate 304, for example, in a direction substantially perpendicular thereto. A containing region 224 is defined at the engaging shell 212 and is adapted to contain the supporting pad 208. The engaging shell 212 is, for example, made of plastic or Nylon 66, which has elasticity, high resistant to fracture, and high strength.

Referring to FIG. 1 and FIG. 3, a plurality of slots 328 are disposed at the margin of the annular flange 220 and are adapted to render the annular flange 220 of the engaging shell 212 compressible and elastic. Hence, when the user exerts forces on the lower part of the annular flange 220, the lower part of the annular flange 220 deforms and retracts. At least one engaging component 332, including but not limited to a pair of engaging components, is disposed on the surface of the annular flange 220 and is adapted to operate in conjunction with at least one engaging slot 448 (including but not limited to a pair of engaging slots) on the second casing 132. After the foot pad structure 200 has been positioned at the receiving space 152, the pair of engaging components 332 can be firmly engaged with and positioned in the pair of engaging slots 448.

The pair of engaging components 332 include, but are not limited to, a pair of fixing blocks disposed on the surface of the elastic annular flange 220. The outline of the fixing block is substantially curved or linear. In the embodiment illustrated in FIG. 1, a wall surface 188 of a part of the second casing 132, defining the receiving space 152, is substantially perpendicular. That is to say, the wall surface 188 of the receiving space 152 is substantially parallel to the surface of the foot pad structure 200 in the perpendicular direction. Referring to FIG. 1, FIG. 2, and FIG. 3, the engaging slots 448 correspond in position to the engaging components 332, respectively. The engaging shell 212 has high elasticity, and the annular flange 220 retracts under external forces applied thereto. Accordingly, after the user has pushed the foot pad structure 200 into the receiving space 152, the annular flange 220 restores its inherent shape because the external forces are no longer applied thereto. Therefore, the engaging components 332 can be firmly engaged with and positioned in the engaging slots 448 such that tight and secure engagement and connection are achieved.

The second casing 132 has the engaging slots 448. The engaging components 332 of the foot pad structure 200 engage with the engaging slots 448. In this manner, the host body portion 108 gets coupled to the foot pad structure 200 by engagement that is more secure than connection with an adhesive. Accordingly, the service life and reliability of products are increased. The supporting pad 208 comprises rubber, for example, and thus has high extendibility, high plasticity, and high restorability so as to be capable of vibration absorption, buffering, anti-slip function, and height adjustment. The supporting pad 208, which is disk-shaped, cylindrical, or of a gradually changing height, operates in conjunction with the engaging shell 212 and thus is received in the containing region 224 defined by the engaging shell 212.

Figure 4:
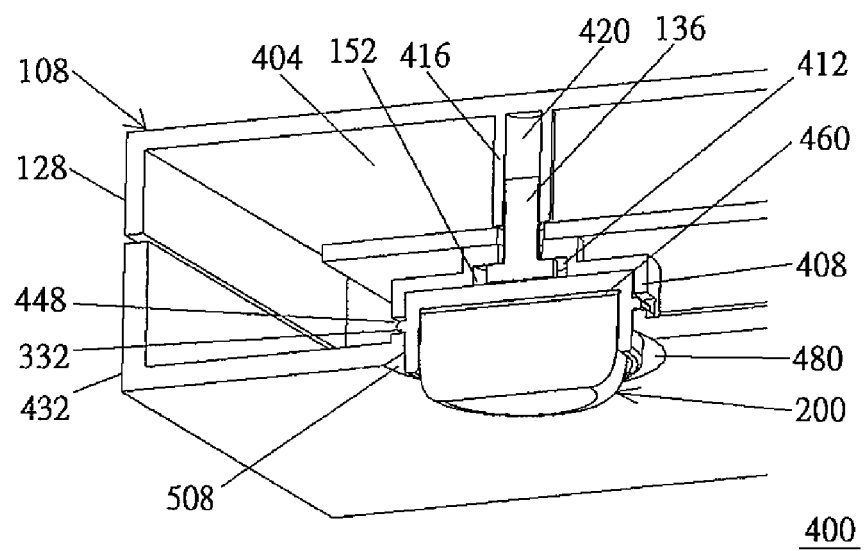
FIG. 4 is a schematic cross-sectional view of the foot pad structure engaging with the host body portion according to an embodiment of the present invention.

The supporting pad 208 and the engaging shell 212 are adhered or coupled to each other by adhesion (including but not limited to a double-sided tape 460 shown in FIG. 4), an adhesive, or by any other equivalent means. Referring to FIG. 2 and FIG. 3, after being received in the engaging shell 212, the supporting pad 208 protrudes from the margin of the annular flange 220 in the direction away from an end of the round plate 304.

FIG. 4 is a schematic cross-sectional view of the foot pad structure 200 and an apparatus 400 using the foot pad structure 200, according to an embodiment, relative to the embodiment shown in FIG. 1. FIG. 4 illustrates the host body portion 108 of the apparatus 400 and the foot pad structure 200. FIG. 4 shows the first casing 128, a second casing 432, and a fastening element 136 such as a screw. After the first casing 128 and the second casing 432 have been coupled together, a space 404 is formed inside the host body portion 108 and adapted to contain the aforesaid hardware components. The first casing 128 has a first connection portion 416 which is substantially cylindrical and has a first recess 420. The second casing 432 has a second connection portion 408, which is substantially cylindrical and has a first through hole 412. The first recess 420 of the first connection portion 416 corresponds in position to the first through hole 412 of the second connection portion 408.

To fasten the host body portion 108, the screw 136 is passed through the first through hole 412 of the second casing 432 and enters the first recess 420 of the first casing 128 and in consequence the first casing 128 and the second casing 432 are fixed. At least one engaging slot 448 (including but not limited to a pair of engaging slots) is disposed at the second connection portion 408 of the second casing 432. The engaging slots 448 correspond in position to the engaging components 332, respectively. Similar to what shown in FIG. 1, due to the engaging shell 212 being elastic, after the foot pad structure 200 has been pushed into the receiving space 152 under external forces, the engaging components 332 are firmly engaged with and positioned in the engaging slots 448, respectively such that tight and secure engagement and connection are achieved.

The second casing 432 has the engaging slots 448. The engaging components 332 of the foot pad structure 200 engage with the engaging slots 448. In this manner, the host body portion 108 is coupled to the foot pad structure 200 by engagement which is more secure than connection with an adhesive. Accordingly, the reusability, service life, and reliability of products are increased. The foot pad structure 200 shown in FIG. 4 is substantially identical to the foot pad structure 200 shown in FIG. 1 in structure. However, for the receiving space 152 defined by the first casing 128 and the second casing 432, the lower part of the second casing 432 positioned near the receiving space 152 is thin or has an oblique surface 508 in order to define a gap 480. Accordingly, a user can insert his fingers or tools into the gap 480 to exert forces on the lower part of the annular flange 220 of the engaging shell 212.

Figure 5:
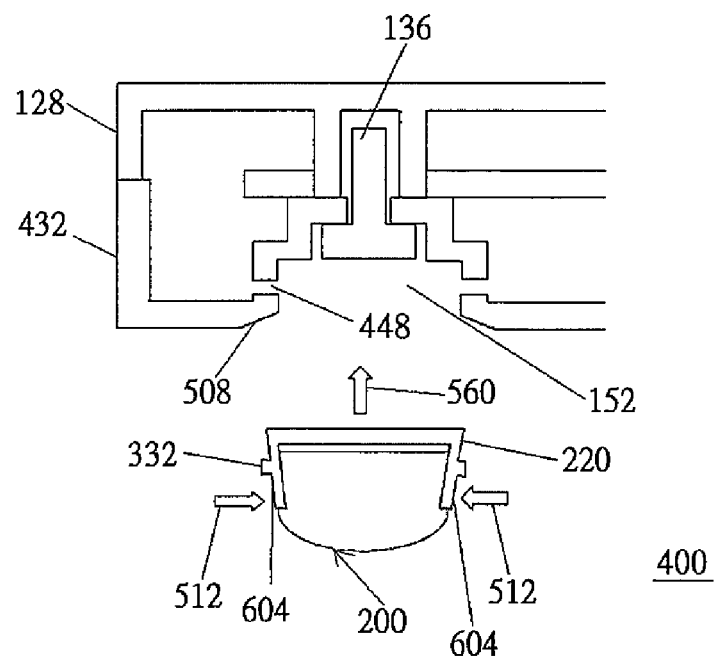
FIG. 5 is a schematic view of operation of the apparatus using the foot pad structure according to an embodiment of the present invention.
Figure 6:
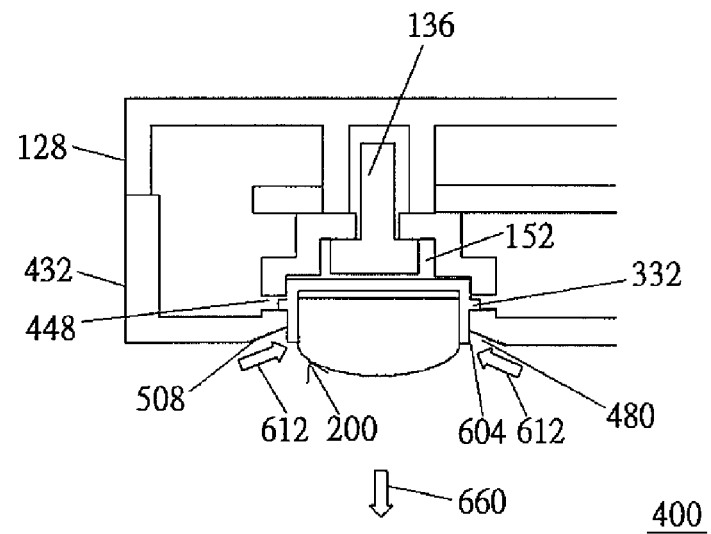
FIG. 6 is a schematic view of operation of the apparatus using the foot pad structure according to one embodiment of the present invention.

FIG. 5 and FIG. 6 are schematic views of operation of the apparatus 400 using the foot pad structure 200 according to one embodiment. The engagement operation of the foot pad structure 200 is depicted by FIG. 5. The disengagement operation of the foot pad structure 200 is depicted by FIG. 6. The foot pad structure 200 shown in FIG. 5 is substantially identical to the foot pad structure 200 shown in FIG. 1 in structure. However, for the receiving space 152 defined by the first casing 128 and the second casing 432, the lower part of the second casing 432 positioned near the receiving space 152 is thin or has an oblique surface 508 in order to define a gap 480 (see FIG. 4 and FIG. 6). Moreover, due to the engaging shell 212 being elastic, the engaging components 332 move inward as forces 512 are exerted on the lower part 604 of the annular flange 220 of the engaging shell 212.

After the foot pad structure 200 has been moved in the direction 560 and pushed into the receiving space 152, the engaging components 332 get engaged with and positioned in the engaging slots 448 such that engagement is achieved. Referring to FIG. 6, to achieve disengagement, the user can put his fingers or a tool into the gap 480 and exert forces on the lower part 604 of the annular flange 220 of the engaging shell 212. Similarly, the engaging components 332 move inward as forces 612 are exerted on the lower part 604 of the annular flange 220 of the engaging shell 212. Meanwhile, the engaging components 332 are detached from the engaging slots 448, and then the foot pad structure 200 moves in the direction 660, such that disengagement is easily achieved.

The disclosed foot pad structure can cover a screw and a screw hole which would otherwise be exposed in order to achieve beauty of the apparatus back. In addition, the foot pad structure can be mounted and dismounted repeatedly without using tools for reworking such that the occurrence of damage to the foot pad structure is reduced. Moreover, unified dimensions and specifications of the engaging shells can be designed such that manufacturers can apply the same engaging shells to a series of products.

Accordingly, foot pad structures have been disclosed herein that can readily be installed and removed.

While the invention has been described with reference to exemplary embodiments, it will be understood by those skilled in the art that various changes may be made and equivalents may be substituted for elements thereof without departing from the scope of the invention. In addition, many modifications may be made to adapt a particular system, device or component thereof to the teachings of the invention without departing from the essential scope thereof. Therefore, it is intended that the invention not be limited to the particular embodiments disclosed for carrying out this invention, but that the invention will include all embodiments falling within the scope of the appended claims. Moreover, the use of the terms first, second, etc. do not denote any order or importance, but rather the terms first, second, etc. are used to distinguish one element from another.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A foot pad structure, adapted for a device housing, comprising:
a supporting pad; and
an engaging shell for containing the supporting pad, wherein at least one engaging component is disposed on an outer surface of the engaging shell and is adapted for engaging with the device housing to fix the engaging shell to the device housing,
wherein the engaging shell comprises a plate and a flange extending from a periphery of the plate to define a supporting pad containing region,
wherein a plurality of slots are provided to a lower part of the flange, said lower part of the flange being distal of the plate, and
wherein the lower part of the flange deforms and retracts by the plurality of slots when forces are exerted on the lower part of the flange, to facilitate engagement of the engaging shell to the device housing and disengagement of the engaging shell from the device housing.

2. The foot pad structure of claim 1, wherein the plate is round, the flange is annular, the outer surface is an annular flange outer surface of the annular flange, the at least one engaging component is a fixing block disposed on the annular flange outer surface, and the at least one engaging component is a curved or linear block.

3. The foot pad structure of claim 1, wherein the supporting pad is received in the supporting pad containing region and coupled to the plate through an adhesive or a double-sided tape.

4. The foot pad structure of claim 1, wherein the engaging shell comprises an elastic material, comprising plastic or Nylon 66, and the supporting pad comprises an extendible material, comprising rubber.

5. The foot pad structure of claim 1, wherein the device housing comprises a first casing and a second casing that are fastened through at least one fastening element, and a receiving space for receiving the foot pad structure is defined at a lower part of the second casing relative to the at least one fastening element.

6. The foot pad structure of claim 5, wherein the first casing has a first connection portion and a first recess, the second casing has a second connection portion and a first through hole, the first recess of the first connection portion corresponds in position to the first through hole of the second connection portion, and the at least one fastening element passes through the first through hole of the second casing and enters the first recess of the first casing in order to fasten the first casing and the second casing.

7. The foot pad structure of claim 5, wherein the at least one engaging component comprises a pair of engaging components, the second casing comprises a pair of engaging slots corresponding in position to the pair of engaging components, and the pair of engaging components is firmly engaged with and positioned in the pair of engaging slots as the foot pad structure is pushed into the receiving space.

8. The foot pad structure of claim 7, wherein an oblique surface is disposed at the lower part of the second casing defining the receiving space in order to define a gap between the second casing and the foot pad structure, and the lower part of the flange of the engaging shell deforms and retracts in response to forces exerted on the lower part of the flange of the engaging shell through the gap such that engagement of the pair of engaging components and the pair of engaging slots and disengagement of the pair of engaging components and the pair of engaging slots are facilitated.

9. An apparatus, comprising:
a device housing comprising at least one fastening element, wherein a receiving space is defined under a lower part of the at least one fastening element; and a foot pad structure adapted for engaging with the device housing, wherein the foot pad structure comprises a supporting pad and an engaging shell for containing the supporting pad, wherein at least one engaging component is disposed on an outer surface of the engaging shell and adapted for engaging with the device housing to fix the engaging shell to the device housing, wherein the engaging shell comprises a plate and a flange extending from a periphery of the plate to define a supporting pad containing region, wherein a plurality of slots are provided to a lower part of the flange, said lower part of the flange being distal of the plate, and wherein the lower part of the flange deforms and retracts by the plurality of slots when forces are exerted on the lower part of the flange, to facilitate engagement of the engaging shell to the device housing and disengagement of the engaging shell from the device housing.

10. The apparatus of claim 9, wherein the foot pad structure covers the at least one fastening element in response to the foot pad structure engaging with the device housing.

11. The apparatus of claim 9, wherein the device housing comprises:

a first casing and a second casing that are fastened through the at least one fastening element, wherein the receiving space is defined at a lower part of the second casing relative to the at least one fastening element.

12. The apparatus of claim 11, wherein the at least one engaging component is adapted for engaging with and being connected to the second casing.

13. The apparatus of claim 12, wherein the plate is round, the flange is annular, the outer surface is an annular flange outer surface of the annular flange, the at least one engaging component is a fixing block disposed on the annular flange outer surface, and the at least one engaging component is a curved or linear block.

14. The apparatus of claim 11, wherein an oblique surface is disposed at the lower part of the second casing defining the receiving space in order to define a gap between the second casing and the foot pad structure, and the lower part of the flange of the engaging shell deforms and retracts in response to forces exerted on the lower part of the flange of the engaging shell through the gap such that the engagement of the engaging shell and the device housing and the disengagement of the engaging shell and the device housing are facilitated.

15. The apparatus of claim 11, wherein the at least one engaging component comprises a pair of engaging components, the second casing comprises a pair of engaging slots corresponding in position to the pair of engaging components, and the pair of engaging components is firmly engaged with and positioned at the pair of engaging slots as the foot pad structure is pushed into the receiving space.

16. The apparatus of claim 11, wherein the first casing has a first connection portion and a first recess, the second casing has a second connection portion and a first through hole, the first recess of the first connection portion corresponds in position to the first through hole of the second connection portion, and the at least one fastening element passes through the first through hole of the second casing and enters the first recess of the first casing in order to fasten the first casing and the second casing.

17. The apparatus of claim 9, where the apparatus is a notebook computer, a tablet, a DVD player, a portable electronic apparatus, a mobile phone, a personal digital assistant (PDA), a server, a home appliance, a measurement instrument, a desktop computer, or an industrial computer.

* * * * *